United States Patent [19]

Kikuchi

[11] Patent Number: 4,591,896
[45] Date of Patent: May 27, 1986

[54] PRESSURE-CONTACT SEALING ARRANGEMENT FOR A SEMICONDUCTOR PELLET

[75] Inventor: Seiki Kikuchi, Hitachi, Japan

[73] Assignee: Hitachi, Ltd., Tokyo, Japan

[21] Appl. No.: 472,237

[22] Filed: Mar. 4, 1983

[30] Foreign Application Priority Data

Mar. 5, 1982 [JP] Japan ................................. 57-33914

[51] Int. Cl.[4] ...................... H01L 23/42; H01L 23/44; H01L 23/46
[52] U.S. Cl. ......................................... 357/79; 357/81; 357/76; 357/75; 361/388; 174/52 P
[58] Field of Search ............... 357/74, 75, 76, 79, 357/81, 65; 174/16 HS, 52 FP; 361/386, 387, 388

[56] References Cited

U.S. PATENT DOCUMENTS

| 3,651,383 | 3/1972 | Livezey et al. | 357/74 |
| 3,686,540 | 8/1972 | Furnival | 357/79 |
| 3,753,053 | 8/1973 | Swartz | 357/79 |
| 3,886,586 | 5/1975 | Bahlinger et al. | 357/79 |
| 4,218,695 | 8/1980 | Egerbacher et al. | 357/79 |
| 4,224,663 | 9/1980 | Maiese et al. | 357/79 |
| 4,399,452 | 8/1983 | Nakashima et al. | 357/74 |
| 4,499,485 | 2/1985 | Schierz et al. | 357/74 |

FOREIGN PATENT DOCUMENTS 0029351  3/1981  Japan ................................. 357/74

Primary Examiner—James W. Davie
Assistant Examiner—Vangelis Economou
Attorney, Agent, or Firm—Antonelli, Terry & Wands

[57] ABSTRACT

An assembled semiconductor device comprising a base constituting one electrode, a semiconductor pellet mounted on the base, an insulation ring located to surround the semiconductor pellet and having a height larger than the thickness of the semiconductor pellet, an electrode member mounted on the insulation ring and in electrical contact with the upper surface of the semiconductor pellet, a lead electrode disposed on the electrode member, a pressure plate mounted on the lead electrode through an insulation member or being formed of an insulation material and disposed on the lead electrode, a bolt screwed into the base, and a pressing device which presses the semiconductor pellet through the pressure plate. The inventive device simplifies the assembling process, makes the maintenance easy, and improves the air-tightness for the semiconductor pellet.

16 Claims, 6 Drawing Figures

PRESSURE-CONTACT SEALING ARRANGEMENT FOR A SEMICONDUCTOR PELLET

BACKGROUND OF THE INVENTION

The present invention relates to a semiconductor device and, more particularly to a high power semiconductor device adapted for use, for example, in a thyristor chopper controller equipped in an electric vehicle.

In designing a high power semiconductor device, considerations must be made on pressing the semiconductor pellet, heat dissipation from the semiconductor pellet and electric connection, so as to meet the requirements that the heat produced by the current within the semiconductor pellet must be dissipated effectively, the semiconductor pellet must be protected from dielectric breakdown caused by the humidity or contamination with dusts, and the semiconductor device must be compact and of light weight.

Conventionally, semiconductor devices have been structured as disclosed typically in U.S. Pat. No. 3,886,586.

The semiconductor device shown in the abovementioned patent comprises upper and lower metal cover plates fixed on an iron ring, and a semiconductor pellet press-fitted to a metal plate located above the pellet with the periphery of the semiconductor pellet being surrounded by an insulation ring formed of such as aluminum oxide.

In the above-mentioned arrangement, the semiconductor pellet and metal cover plate, and the metal cover plate and metal plate form planar connections which are achieved by soldering. The upper and lower iron rings and the peripheral insulation ring are required to have air-tightness, and they are fitted by hard soldering.

Therefore, in spite of the fact that the structure is made up of relatively simple component parts, the fabricating process for the above-mentioned semiconductor device cannot be simplified. The foregoing structure is also disadvantageous from the viewpoint of maintenance of the semiconductor device. Moreover, soldering of components does not provide sufficient reliability for such uses that requires a high durability against vibration, as in electric automobiles.

SUMMARY OF THE INVENTION

It is an object of the present invention to provide a semiconductor device which simplifies the fabricating process and has superior air-tightness.

According to an aspect of the invention, a semiconductor device is assembled with a base which serves as one electrode, a semiconductor pellet mounted on the base, an elastic insulation ring located around the semiconductor pellet and having a height larger than the thickness of the semiconductor pellet, an electrode member electrically connected to the upper surface of the semiconductor pellet and depressing and sealing said insulation ring, a lead electrode integrated with or located on the electrode member, a pressure member formed of an insulation material, or insulated from the lead electrode with an insulating member and placed on the lead electrode, a bolt screwed into the base, and a pressing mechanism supported by the bolt and pressing the semiconductor pellet through the pressing member. When the base plate and/or the electrode member have a recess for receiving the insulation ring, the insulation ring preferably has an extra thickness. The semiconductor device simplifies the fabricating process, enhances maintenance, and improves the air-tightness of the semiconductor pellet.

The semiconductor device is structured such that the insulation ring can easily be positioned with respect to the base, and the electrode member can easily be positioned with respect to the insulation ring.

DESCRIPTION OF THE PREFERRED EMBODIMENTS

Figure 1:
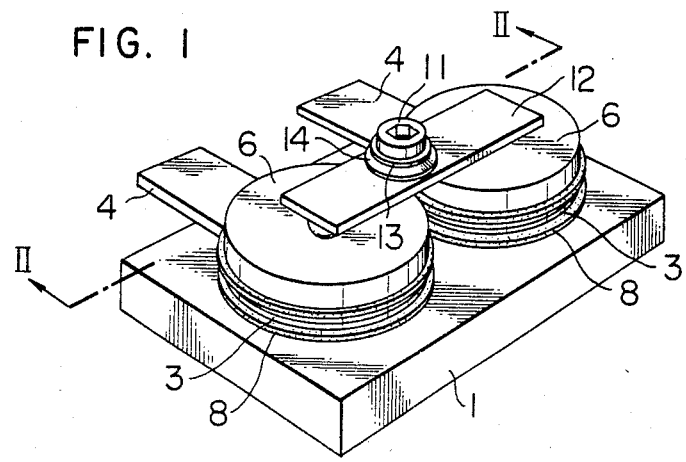
FIG. 1 is a perspective view of a dual-diode device according to one embodiment of the present invention.
Figure 2:
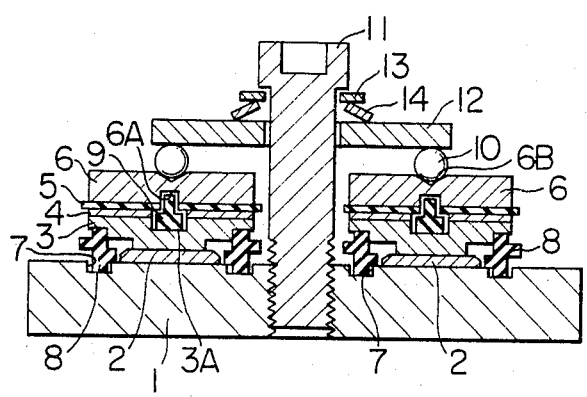
FIG. 2 is a cross-sectional view taken along the line II—II of FIG. 1.
Figure 3:
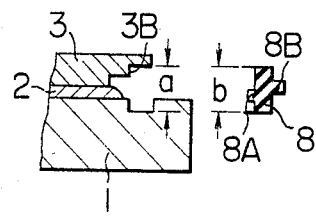
FIG. 3 is an illustration showing in magnified scale a part of FIG. 2.

The present invention will now be described with reference to the drawings. FIGS. 1, 2 and 3 show one embodiment of the present invention, where a plugging diode and a fly-wheel diode are packed in pair as a semiconductor device used in the thyristor chopper equipped in an electric vehicle.

On each diode portion of a base 1 formed of a planar metal such as aluminum or copper plate and adapted to serve as a common electrode, there is superposed a disk-shaped semiconductor pellet 2, a conductive auxiliary electrode member 3, a lead electrode 4, an insulation plate 5, and a disk-shaped pressure plate 6 in this order. An annular groove 7 is formed around each of the semiconductor pellets 2 on the upper surface of the base 1. In each groove 7, the lower end of an insulation ring 8 formed of rubber, nylon, tetrafluoroethylene, etc. is fitted in engagement. The upper end of the ring 8 is abutted against the bottom face of the auxiliary electrode member 3. In a central portion of the arrangement where the upper face of the auxiliary electrode member 3 confronts the bottom face of the pressure plate 6, there are formed recesses 3A and 6A for accommodating an insulation pin 9 shaped in inverted-tee or inverted T on the axial cross section. The insulation pin 9 extends through the central portion of the lead electrode 4 and insulation plate 5, and serves to facilitate the positioning of the auxiliary electrode member 3, lead electrode 4, insulation plate 5, and pressure plate 6. Owing to the inverted T-shaped insulation, the insulating length between the lead electrode 4 and the pressure plate 6 is made long to enhance the dielectric strength. A steel ball 10 is placed on a recess 6B formed in the central portion on the upper face of each pressure plate 6. The steel balls 10 are pressed by a steel plate 12 which is supported by a bolt 11 screwed into the base 1 at a portion between the two semiconductor pellets 2. Screwing the bolt 11 presses a washer 13 and a belleville spring 14 against the steel plate 12. The belleville spring 14 expands or contracts depending on the amount of screwing of the bolt 11 so that the pressure transmitted to the semiconductor pellets 2 through the plate 12 is adjusted. Each steel ball 10 presses the pressure plate 6 at a single point so that a uniform pressing force is applied to the semiconductor pellets 2 through the pressure plates 6, insulation plates 5, lead electrodes 4, and auxiliary electrode members 3.

As shown in FIG. 3, annular protrusions 8A and 8B are formed inside and outside of the insulation ring 8. The protrusion 8A is formed to contact the rim of the semiconductor pellet 2 so as to facilitate the positioning of the pellet 2. The protrusion 8B is provided to make the insulating length between the base 1 and the auxiliary electrode member long so as to improve the dielectric strength. The insulation ring 8 is formed of a flexible or elastic insulation material and dimensioned to have a height (dimension b in FIG. 3) larger than the distance between the bottom face of the auxiliary electrode member 3 and the bottom of the groove 7 (distance a in FIG. 3) when the member 3 is in contact with the upper surface of the semiconductor pellet 2. Accordingly, the insulation ring 8 is pressfitted to the auxiliary electrode member 3 and the base 1, and the semiconductor pellet 2 is enclosed within a hermetic structure. The auxiliary electrode member 3 has an offset section 3B so that it is fitted to the interior wall of the insulation ring 8, thereby facilitating its positioning to the upper face of the insulation ring.

The insulation plate 5 may be made of an insulation material such as rubber, resin, plastic such as polyethylene terephthalate, ceramic, etc. The auxiliary electrode member 3 and lead electrode 4 are usually made of high-conductivity aluminum or copper, and they may be formed as an integral part. The pressure plate 6 may be formed of a planar steel sheet or aluminum sheet. Naturally, the shape is not restricted to plate or sheet. The pressing force of the pressure plate 6 can be adjusted by using a flat spring in place of a belleville spring, but the use of a belleville spring is advantageous from the viewpoint of manufacturing cost.

Assemblage of the device may be performed in the following way. First, a pair of semiconductor pellets 2 are placed on the base 1, and they are held by the insulation rings 8 which are set in the grooves 7.

Next, the insulation rings 8 are overlaid with the auxiliary electrode members 3 with the insulation pins 9 being placed at the central portions thereof, then the lead electrodes 4, insulation plates 5 and pressure plates 6 are placed over the auxiliary electrode members 3 with the center of each component set coinciding with each other.

After that, the steel balls 10 are placed and the pressing plate 12 is placed over both steel balls. Then, the bolt 11 is screwed to clamp both component sets, and assembly is completed.

As described above, component parts are assembled in one-way access, and the semiconductor device is completed merely by clamping the bolt. Accordingly, the semiconductor pellet can be assembled easily, and air-tightness of the device can be enhanced.

Moreover, according to this embodiment, the laminated portion of the semiconductor device is guided by and engaged with the insulation rings and insulation pins. This provides accuracy and easiness of positioning in the assembling process, and consequently, the assembling process is simplified considerably.

In addition, the simple structure and simplified assembling process make the maintenance of the device easy and also allow miniaturization of the device.

Figure 4:
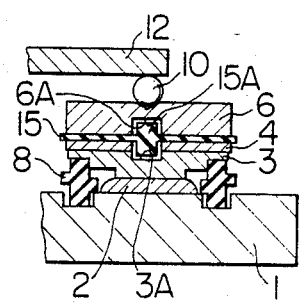
FIG. 4 is a partial cross-sectional view showing another embodiment of the present invention.

FIG. 4 shows a partial cross section of another embodiment of the present invention. In the figure, similar reference numerals are used for similar components or equivalent components having similar functions as those shown in FIG. 1, and explanation thereof will be omitted.

Figure 6:
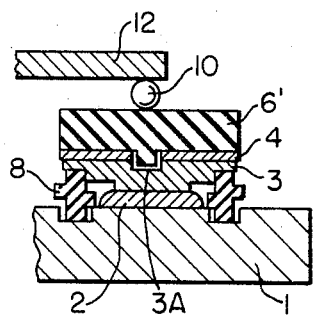

The embodiment of FIG. 4 differs from the embodiment shown in FIG. 1 in that an insulation plate is formed integrally with an insulation pin. That is, an insulation plate 15 in FIG. 4 is formed to have pin sections 15A projecting outwardly at the central portion of both surfaces. The pin section 15A penetrates the lead electrode 4 to go into a recess 3A in the auxiliary electrode member 3 on one side and into a recess 6A of the pressure plate 6 on the other side. A simpler way is to make the pressure plate 6 and insulation pin 15A integrally with an insulation material as shown by the insulating pressure plate 6' in FIG. 6.

Consequently, according to this embodiment, the manufacturing process and assembling process can further be simplified in addition to the effects of the previous embodiment shown in FIG. 1, and the dielectric strength of the semiconductor device can further be improved.

In the foregoing embodiments, a pair of semiconductor pellets are clamped evenly using a single bolt. However, a resilient member may be used as a dummy pellet so as to construct a device having one semiconductor pellet. The semiconductor device comprises, in general, a diode, thyristor, and the like.

Figure 5:
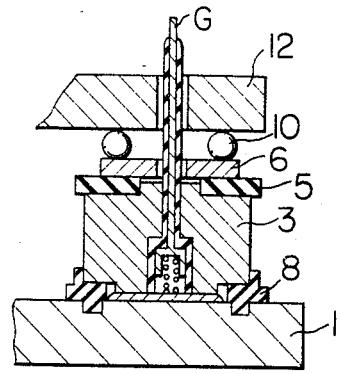
FIGS. 5 and 6 are cross-sectional views of a thyristor according to another embodiments of the present invention.

FIG. 5 shows the structure of the tyristor embodying the present invention, where like reference numbers denote like component parts throughout FIGS. 1-5.

A thyristor is formed in the silicon pellet 2. The pellet 2 has a gate electrode layer in the central portion of the upper surface, a cathode electrode layer in the peripheral portion of the upper surface, and an anode electrode layer on the entire bottom surface. The pellet 2 is mounted on the base 1 which serves as an anode electrode, and positioned by means of an insulation seal ring 8. In the central portion of the auxiliary electrode member 3 which acts as a cathode electrode, a gate lead electrode G is embedded hermetically through an insulation layer. The lower portion of the gate lead G is connected electrically to a coil spring which is in press-contact with the gate electrode layer at the center of the upper surface of the pellet 2. When the auxiliary electrode member 3 is pressed to the upper surface of the wafer 2 so as to achieve a press-contact between the cathode electrode layer and the auxiliary electrode member 3, the coil spring of the gate lead G is also made in press-contact with the gate electrode layer. The cathode lead wire is connected directly to the auxiliary electrode member 3. The insulation member 5 serves to insulate the auxiliary electrode member 3 from the pressure member. The pressure plates 6 and 12 are provided with centrally located through-holes. In the arrangement of FIG. 5, due to the presence of the gate lead G, two steel balls 10 located symmetrically with respect to the central axis are used to conduct the pressure applied by the pressure plate 12 to the pressure plate 6.

The assembly of the thyristor can be carried out simply by piling the component parts as in the cases of the diode shown in the previous embodiments.

What is claimed is:

1. A semiconductor device comprising a base constituting one electrode and having one pellet mounting surface, a pair of semiconductor pellets mounted on said pellet mounting surface, a ring member being elastic and electrically insulating and located on said base around each of said semiconductor pellets and having a height larger than the thickness of said semiconductor pellets, a pair of conductive electrode members, each depressing and sealing said ring member and each electrically contacting a corresponding one of said semiconductor pellets, a common insulated pressure member which presses said conductive electrode members, and a single bolt which is screwed into said base and provides a pressing force for said pressure member at an intermediate portion between the pellets, the abovementioned component parts being superposed and assembled under the pressing force.

2. A semiconductor device according to claim 1, wherein a groove is formed in said pellet mounting surface to fit the lower end of said ring member on the upper surface of said base.

3. A semiconductor device according to claim 1, wherein said ring member is totally made of an elastic insulation material.

4. A semiconductor device according to claim 2, wherein said ring member is provided with a protrusion which is in contact with the rim of said semiconductor pellet.

5. A semiconductor device comprising a base constituting one electrode and having a contact surface, a pair of semiconductor pellets mounted on the contact surface of said base, a pair of ring members formed of an elastic insulation material, placed on the base around each of said semiconductor pellets through a positioning member and having a height larger than the thickness of said semiconductor pellets, a pair of auxiliary electrode members respectively depressing and sealing each of said ring members and respectively electrically contacting a corresponding one of said semiconductor pellets, a lead electrode located on the upper surface of each of said auxiliary electrode members, a pair of pressure plates which are respectively placed on the upper surface of each of said lead electrodes through corresponding insulation plates which respectively press said insulation plate, a pair of pressing members, each of which presses a corresponding pressure plate, a common rigid plate placed in contact with the upper portion of said pressing members, and a single bolt which is screwed into said base and provides a pressing force for said rigid plate at an intermediate portion between the pellets, the abovementioned component parts being superposed and assembled under the pressing force.

6. A semiconductor device according to claim 5, wherein said pressure plate has a positioning recess and each of said pressing members comprises a ball which is positioned in the positioning recess.

7. A semiconductor device according to claim 5, wherein each of said auxiliary electrode members, each of said lead electrodes, each of said insulation plates, and each of and said pressure plate are axially aligned by means of an insulation pin.

8. A semiconductor device according to claim 7, wherein said insulation pin is formed integrally with said insulation plates.

9. A semiconductor device according to claim 7, wherein each of said pressure plates, each of said insulation plates, and said insulation pin are formed as an integral part.

10. A semiconductor device comprising:

a pair of semiconductor pellets;
a common base for mounting said pair of semiconductor pellets at different portions on one surface of said common base and constituting a common electrode for said semiconductor pellets;
a pair of ring members respectively formed of an elastic insulation material disposed around each of said semiconductor pellets;
a pair of conductive electrode members respectively disposed and pressurized on each of the semiconductor pellets to form conductive pressure contact with the associated semiconductor pellet, the conductive electrode members being disposed also on the associated ring member and pressing the ring member upon completion of said pressure contact;
said base, said electrode member and said associated ring member forming a sealed housing;
a pair of insulated pressure members respectively disposed on each of said conductive electrode members for transmitting pressure to the associated conductive electrode member; and
common means for applying pressure to both of said insulated pressure members for urging said pressure contact for each of said semiconductor pellets, said means including a single fastening member disposed at an intermediate portion of the semiconductor pellets and mechanically engaged with said base.

11. A semiconductor device according to claim 10, wherein each of said insulated pressure members includes a pressure plate having a recess on an upper surface and a ball accomodated in the recess.

12. A semiconductor device according to claim 11, wherein said common means further includes a pressure transmitting member bridging over said balls and a spring member supported by said fastening member and applying pressure to said pressure transmitting means.

13. A semiconductor device according to claim 10, wherein each of said ring members has an inward projection for guiding said semiconductor pellet.

14. A semiconductor device according to claim 13, wherein said base has a groove around each semiconductor pellet for accomodating each of said insulation rings.

15. A semiconductor device according to claim 1, wherein said conductive electrode member further includes a channel passing from said semiconductor pellet through said conductive electrode member, wherein said channel includes an additional electrode for contacting a predetermined portion of said semiconductor pellet and an insulating layer for insulating said additional electrode from said conductive electrode member.

16. A semiconductor device according to claim 10, wherein said conductive electrode member further includes a channel passing from said semiconductor pellet through said conductive electrode member, wherein said channel includes an additional electrode for contacting a predetermined portion of said semiconductor pellet and an insulating layer for insulating said additional electrode from said conductive electrode member.

* * * * *